United States Patent
Ballo et al.

(10) Patent No.: US 9,939,479 B2
(45) Date of Patent: Apr. 10, 2018

(54) NOISE FIGURE MEASUREMENT USING NARROWBAND COMPENSATION

(71) Applicant: Keysight Technologies, Inc., Minneapolis, MN (US)

(72) Inventors: David J. Ballo, Santa Rosa, CA (US); James B. Kerr, Santa Rosa, CA (US); Robert E. Shoulders, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 605 days.

(21) Appl. No.: 14/260,976

(22) Filed: Apr. 24, 2014

(65) Prior Publication Data

US 2015/0309101 A1    Oct. 29, 2015

(51) Int. Cl.
*G01R 29/26* (2006.01)
*G01R 23/20* (2006.01)
*G01R 27/28* (2006.01)

(52) U.S. Cl.
CPC ............. *G01R 29/26* (2013.01); *G01R 23/20* (2013.01); *G01R 27/28* (2013.01)

(58) Field of Classification Search
CPC ......... G01R 23/20; G01R 29/26; G01R 27/28
USPC ........................................................ 324/613
See application file for complete search history.

(56) References Cited

U.S. PATENT DOCUMENTS

| | | | | |
|---|---|---|---|---|
| 2,206,695 A * | 7/1940 | Guanella | ................. | H03J 7/042 331/15 |
| 4,801,861 A * | 1/1989 | Ashley | ................. | G01R 23/165 324/613 |
| 5,191,294 A * | 3/1993 | Grace | ..................... | G01R 29/26 324/613 |
| 5,337,014 A * | 8/1994 | Najle | ..................... | G01R 29/26 324/613 |
| 5,337,261 A * | 8/1994 | Rogers | ................. | G01R 31/001 324/613 |
| 5,608,331 A * | 3/1997 | Newberg | ................ | G01R 29/26 324/613 |
| 6,509,742 B1 * | 1/2003 | Ebizuka | ............. | G01R 29/0821 324/613 |
| 6,980,915 B2 * | 12/2005 | Gorin | ..................... | G01R 23/16 324/617 |
| 7,952,364 B2 * | 5/2011 | Kim | ..................... | H03H 1/0007 324/551 |

(Continued)

OTHER PUBLICATIONS

Jacques Christophe Rudell; Frequency Translation Techniques for High-Integration High-Selectivity Multi-Standard Wireless Communication Systems; Graduate Division of the University of California, Berkeley; Fall 2000; pp. 1-326.*

*Primary Examiner* — Patrick Assouad
*Assistant Examiner* — Christopher McAndrew

(57) ABSTRACT

A method of determining a noise figure (NF) response of a device under test (DUT) comprises determining a frequency response of a noise receiver over a first frequency range, measuring a gain of the DUT over a second frequency range encompassing the first frequency range, measuring output-noise power of the DUT over the second frequency range, determining an estimated gain of the DUT based on the frequency response of the noise receiver and the gain of the DUT over the first frequency range, and determining the NF response of the DUT over the second frequency range based on the estimated gain and the output-noise power.

20 Claims, 8 Drawing Sheets

(56) References Cited

U.S. PATENT DOCUMENTS

| | | | | |
|---|---|---|---|---|
| 8,283,932 B2* | 10/2012 | Yu | ............ | G01R 29/26 |
| | | | | 320/107 |
| 2003/0031241 A1* | 2/2003 | Mar | ............ | G01R 23/20 |
| | | | | 375/224 |
| 2003/0125894 A1* | 7/2003 | Dunsmore | ............ | G01S 7/4004 |
| | | | | 702/109 |
| 2005/0216214 A1* | 9/2005 | Gorin | ............ | G01R 23/16 |
| | | | | 702/76 |
| 2010/0026316 A1* | 2/2010 | Yamanaga | ............ | G01R 29/0814 |
| | | | | 324/613 |
| 2010/0079170 A1* | 4/2010 | Mattes | ............ | G01R 19/2506 |
| | | | | 327/1 |
| 2010/0194405 A1* | 8/2010 | Yu | ............ | G01R 29/26 |
| | | | | 324/613 |
| 2010/0321035 A1* | 12/2010 | Masuda | ............ | G01R 29/0878 |
| | | | | 324/613 |
| 2013/0135150 A1* | 5/2013 | Kenoun | ............ | H01Q 9/0421 |
| | | | | 343/700 MS |
| 2013/0221987 A1* | 8/2013 | Cranford, Jr. | ............ | G11C 29/50 |
| | | | | 324/613 |

* cited by examiner

S410

```
┌─────────────────────────────────────────────┐
│ PERFORM NOISE-RECEIVER CALIBRATION OVER SECOND │
│ FREQUENCY RANGE F2 TO DETERMINE GAIN-BANDWIDTH │──S605
│   PRODUCT OF NOISE RECEIVER AND S-PARAMETER    │
│    VECTOR-ERROR CORRECTION TERMS FOR EACH      │
│  FREQUENCY POINT f2 IN SECOND FREQUENCY RANGE F2│
└─────────────────────────────────────────────┘
                      │
                      ▼
┌─────────────────────────────────────────────┐
│   CONNECT DUT BETWEEN TEST PORTS 1 AND 2 OF    │──S610
│              NETWORK ANALYZER                  │
└─────────────────────────────────────────────┘
                      │
                      ▼
┌─────────────────────────────────────────────┐
│     SWEEP FREQUENCY RANGE F2 AND MEASURE       │──S615
│    S-PARAMETERS AND OUTPUT-NOISE POWER OF DUT  │
└─────────────────────────────────────────────┘
```

FIG.6

NOISE FIGURE MEASUREMENT USING NARROWBAND COMPENSATION

BACKGROUND

Noise figure (NF) is a widely-used metric for describing signal-to-noise-ratio (SNR) degradation that occurs to a signal passing through an electrical network. The noise factor (F) of a network is generally defined as the input SNR divided by the output SNR: $F=(S_i/N_i)/(S_o/N_o)$, where $S_i$=input signal power, $S_o$=output signal power, $N_i$=input noise power, and $N_o$=output noise power. NF is the noise factor expressed in decibels: $NF=10*\log(F)$.

For non-passive electronic components, a significant source of degradation is noise generated from internal active devices, such as transistors. Accordingly, NF measurements are often a necessary part of device characterization in research and development, and process verification in manufacturing.

Two techniques are commonly used to measure NF: a Y-factor method and a cold-source method. The Y-factor method (also called hot/cold-source method) is the predominant approach and is most commonly implemented with noise-figure analyzers and spectrum analyzer-based solutions. The Y-factor method uses a calibrated noise source that includes a noise-optimized avalanche diode that can be turned on and off. The diode is followed by an attenuator, which ensures a good output match.

Where the diode has no bias applied (i.e., in a cold state), the noise source generates the same noise as a room-temperature termination. Where bias is applied to the diode (i.e., in a hot state), a resulting avalanche breakdown creates considerable electrical noise over and above that of a room-temperature termination. The amount of extra noise is characterized as an "excess noise ratio" (ENR). Typical ENR values are in the range of 5 to 15 dB. The gain and noise figure of a device-under-test (DUT) can be determined from two separate measurements of output-noise power resulting from the cold and hot input terminations. Assuming calibrated noise-power measurements, noise factor $F=ENR/(Y-1)$, where $Y=N_{o\text{-}hot}/N_{o\text{-}cold}$, i.e., a ratio of DUT output noise powers in the hot and cold states of the noise source at the DUT input.

In contrast, the cold-source method is usually performed using a vector network analyzer (VNA), which provides magnitude and phase information, making it possible to achieve greater measurement accuracy by using advanced error-correction methods. The improved accuracy may be most dramatic for non-coaxial environments such as those where the DUT is measured in a fixture or while still part of a semiconductor wafer. Due to the improved accuracy, the cold-source method is preferred in many component-test scenarios.

The cold-source method combines traditional S-parameter measurements of a DUT with a single measurement of output-noise power resulting from a cold input termination (typically at room temperature). These two portions of the NF measurement generally happen sequentially, as follows. First the DUT's S-parameters are measured using a built-in sinusoidal source and standard VNA receivers, and the DUT's gain is determined from the S-parameters. Second, the sinusoidal source is turned off, and an output-noise power measurement is made using either a dedicated low-noise receiver or one of the standard VNA receivers. An underlying principle of the cold source method can be appreciated by rearranging the terms in the above definition of NF and substituting gain (G) for the ratio $S_o/S_i$: $F=N_o/(G \times N_i)$. For a known input noise $(N_i)$ due to an input termination at a known temperature, F can be calculated by measuring the gain (G) and output noise $(N_o)$ of the DUT.

Many devices exhibit a gain and NF response that has relatively small variation versus frequency. For such devices, the Y-factor and cold-source method produce substantially the same results, with varying degrees of accuracy. Many other devices, however, contain integral bandpass filters, which result in large changes in gain and NF at transition regions between the filters' in-band and out-of-band response, the cold source method may introduce distortion in the noise figure measurement which does not occur with the Y-factor method. If the DUT's bandwidth is not significantly larger than the bandwidth of the receiver used to measure the output noise, the distortion can be significant.

In view of these and other shortcomings of conventional approaches, there is a general need for new techniques for making NF measurements.

SUMMARY

In a representative embodiment, a method of determining an NF response of a DUT comprises determining a frequency response of a noise receiver over a first frequency range, measuring a gain of the DUT over a second frequency range encompassing the first frequency range, measuring output-noise power of the DUT over the second frequency range, determining an estimated gain of the DUT based on the frequency response of the noise receiver and the gain of the DUT over the first frequency range, and determining the NF response of the DUT over the second frequency range based on the estimated gain and the output-noise power.

In some embodiments, determining the estimated gain of the DUT comprises multiplying the frequency response of the noise receiver by the determined gain of the DUT over the first frequency range, and normalizing a product of the multiplication.

In some embodiments, determining the frequency response of the noise receiver over the first frequency range comprises, with a cable connected directly between first and second test ports of the network analyzer, measuring a noise floor of the noise receiver, and measuring power of the noise receiver and a reference receiver while sweeping a test signal over the first frequency range, and determining the frequency response of the noise receiver over the first frequency range based on the measured noise floor, the measured power of the noise receiver, and the measured power of the reference receiver.

In some embodiments, determining the gain of the DUT over the second frequency range comprises, with the DUT connected between first and second test ports of the network analyzer, sweeping a test signal across the second frequency range and measuring S-parameters of the DUT based on the swept test signal. The output-noise power of the DUT may be measured over the second frequency range, the gain-bandwidth product of the noise receiver may be determined over the second frequency range, and S-parameter vector-error correction terms of the noise receiver may be determined over the second frequency range. Determining the estimated gain of the DUT may comprise, in the frequency domain, for a specified frequency in the second frequency range, multiplying the frequency response of the noise receiver by the gain of the DUT over the first frequency range to produce a first product, multiplying the first result by the gain-bandwidth product to produce a second product, and integrating the second product to produce an estimated gain term for the specified frequency.

In some embodiments, the NF response is determined according to an equation NF=10 log($N_o$/(G'k$T_o$B)), wherein G' denotes the estimated gain of the DUT, $N_o$ denotes the output-noise power of the DUT, $T_o$ denotes a reference temperature, k denotes Boltzmann's constant, and B denotes a noise bandwidth of the noise receiver.

In some embodiments, determining the frequency response of the noise receiver over the first frequency range comprises accessing a file including a stored representation of the frequency response.

In another representative embodiment, a method of determining an NF response of a DUT comprises, for a specified frequency point, multiplying gain values of the DUT across a first frequency range with a frequency response of a noise receiver across the first frequency range, integrating a result of the multiplication to produce a normalization factor, and dividing the result of the multiplication by the normalization factor to produce an effective gain value of the DUT at the specified frequency point, and determining an NF value for the specified frequency point based on the effective gain value of the DUT and an output-noise power of the DUT.

In another representative embodiment, a system configured to determine an NF response of a DUT comprises a network analyzer comprising a noise receiver, a first module configured to determine a frequency response of the noise receiver over a first frequency range, a second module configured to measure a gain of the DUT over a second frequency range encompassing the first frequency range, a third module configured to measure output-noise power of the DUT over the second frequency range, a fourth module configured to determine an estimated gain of the DUT based on the frequency response of the noise receiver and the gain of the DUT over the first frequency range, and a fifth module configured to determine the NF response of the DUT over the second frequency range based on the estimated gain and the output-noise power.

BRIEF DESCRIPTION OF THE DRAWINGS

The described embodiments are best understood from the following detailed description when read with the accompanying drawing figures. Wherever applicable and practical, like reference numerals refer to like elements.

FIG. 6 is a flowchart illustrating another operation in the method of FIG. 4 in further detail, according to a representative embodiment.

DETAILED DESCRIPTION

Figure 1:
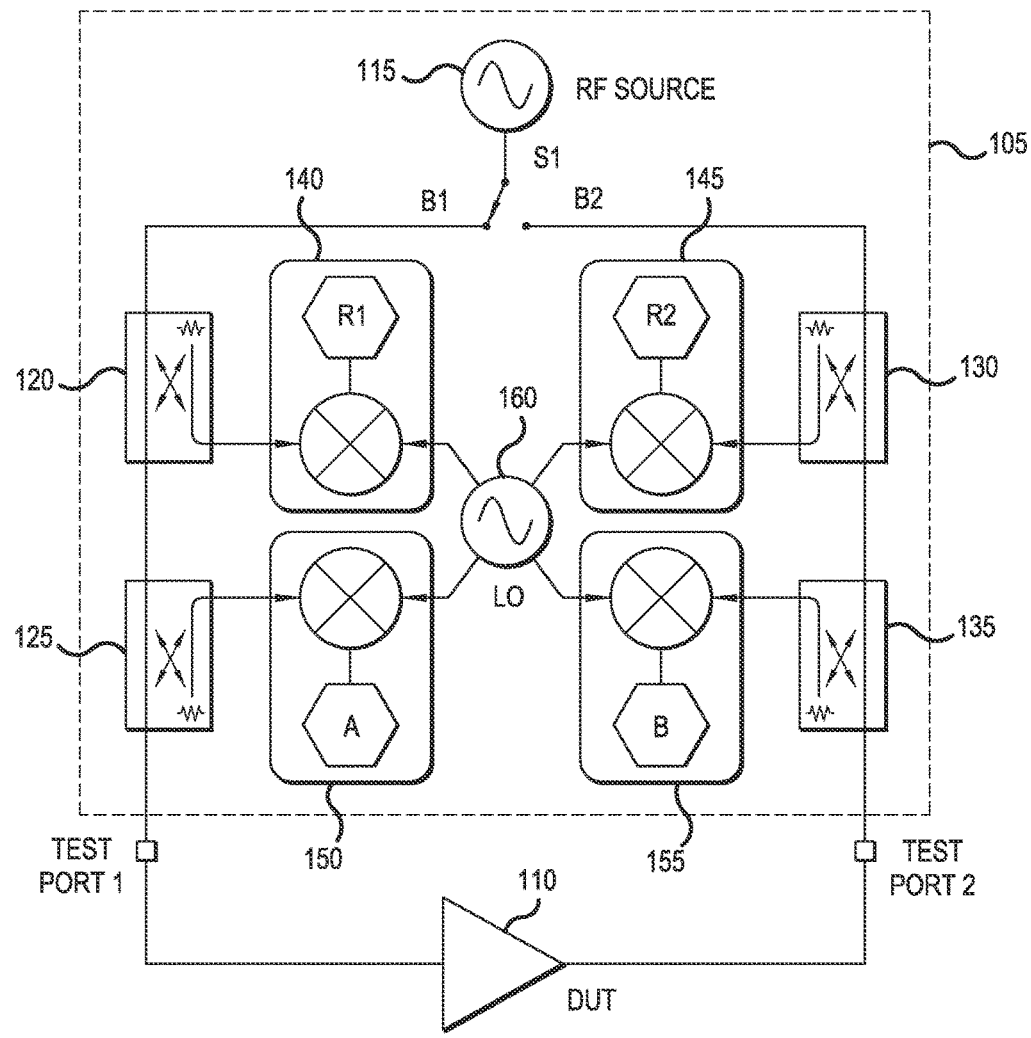
FIG. 1 is a simplified diagram of a system configured to determine the NF response of a DUT, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to techniques for measuring the NF of electrical networks. These techniques may eliminate distortion that may otherwise occur at band edges of narrowband devices when using the cold-source method. Accordingly, they may enable advanced error-correction methods for superior measurement accuracy in vector network analyzers and other contexts.

In certain embodiments, NF is determined by the cold-source method using an estimated gain value. The estimated gain value is determined for a specified frequency point based on measurements of gain and output-noise power performed over a frequency range encompassing the specified frequency point. The estimated gain value is then combined with a measurement of output-noise power at the same frequency point to produce a value of NF for that frequency point. Similar operations are performed for other frequency points to produce an NF response for a DUT.

The estimated gain value is calculated based on information regarding the frequency response of a noise receiver. This information is typically acquired prior to making NF measurements and then saved in a file for later use. It may be assumed that the noise receiver's frequency response is stable over time, which is a reasonable assumption for most modern, high-quality VNAs. At the specified frequency point, DUT gain values on either side of the frequency point are multiplied by the frequency response of the noise receiver and then integrated and normalized to produce an estimated gain value that takes into account the gain change over the frequency span associated with the noise bandwidth. Such a process can be referred to as narrowband compensation. Where the NF response is calculated with the estimated gain value, it may produce significantly better results than a conventional implementation of the cold-source method, as will be apparent from the following description.

FIG. 1 is a simplified diagram of a system 100 configured to determine the NF response of a DUT, according to a representative embodiment. System 100 represents one possible context in which NF measurement techniques may be performed according to various embodiments. The described concepts, however, are not limited to the illustrated context and could be implemented with different systems, e.g. those with different types of network analyzers, different test instruments, or different VNA configurations. Moreover, the described concepts are not limited to the operations described in relation to system 100, which are mere illustrative examples.

Referring to FIG. 1, system 100 comprises a VNA 105 and a DUT 110. VNA 105 comprises a signal source 115 (e.g., an RF source), first through fourth directional couplers 120, 125, 130 and 135, first and second reference receivers 140 and 145 (receivers R1 and R2), first and second test receivers 150 and 155 (receivers A and B), and a local oscillator (LO) 160. DUT 110 is connected to VNA 105 through a first test port 1 and a second test port 2. Although not shown in FIG. 1, system 100 typically further comprises equipment for controlling signal source 115 and for processing and displaying measurements captured by the reference and test receivers.

To measure S-parameters of DUT 110, signal source 115 applies a test signal (e.g., a frequency swept sinusoid) to a first branch B1 or a second branch B2 according to a configuration of a switch S1. The test signal is generally applied to first branch B1 when measuring the following S-parameters: input port reflection coefficient S11 and forward voltage gain S21. Similarly, the test signal is generally applied to second branch B2 when measuring the following S-parameters: output port reflection coefficient S22, and reverse voltage gain S12.

The test signal applied to first branch B1 is transmitted to first reference receiver 140 via first directional coupler 120, and it is also transmitted to DUT 110 via first test port 1. A portion of the test signal incident at DUT 110 is reflected back to first test receiver 150 via first test port 1 and second directional coupler 125. Another portion of the test signal incident at DUT 110 is transmitted to second test receiver 155 via DUT 110, second test port 2, and fourth directional coupler 135. The respective signals received by first reference receiver 140 and first and second test receivers 150 and 155 are downconverted by mixing them with an LO signal produced by LO 160, and the resulting downconverted signals are processed (e.g., by a processor, not shown) to determine the forward voltage gain S21 and input port reflection coefficient S11 of DUT 110.

Similar operations are performed where the test signal is applied to second branch B2 to determine output port reflection coefficient S22 and reverse voltage gain S12, with second reference receiver measuring the incident test signal, second test receiver 155 measuring the reflected test signal, and first test receiver 150 measuring the transmitted test signal.

To measure output-noise power of DUT 110, signal source 115 is turned off and the output-noise power is measured while an input termination of DUT 110 is at room temperature, or some other known temperature. The output-noise power can be measured by VNA receivers such as those illustrated in FIG. 1, or it can be measured by some other component, such as a dedicated low-noise receiver, which may be integrated into the VNA. In general, any component used to measure noise may be referred to as a noise receiver in the description that follows.

As indicated above, NF may be determined based on a measurement of the gain of the DUT, a measurement of output-noise power of the DUT, and a known input-noise power. However, unless the DUT's bandwidth is significantly larger than the noise bandwidth of the noise receiver, distortion may occur in NF measurements near transition regions between the in-band response and out-of-band response of the DUT.

One reason for this distortion is that measurement of output-noise power at one frequency point may depend on output-noise power at adjacent frequency points, while a measurement of gain at the same frequency point does not depend upon the gain of other frequency points. This discrepancy tends to create inaccuracies near the transition regions of the DUT's frequency response. As an example, where noise measurements are made in a passband of a DUT including an integral bandpass filter, the measured output-noise power near the edge of the passband will generally include noise from the passband plus smaller noise amounts from outside the passband. This means that the overall amount of measured output-noise power will be smaller for frequencies in the passband near its edge, resulting in a displayed NF that is less than the actual NF. As another example, where noise measurements are made in a transition region outside the passband, relatively wide noise bandwidth allows noise from the passband region or an upper transition region to be included in the noise-power measurement. This means that the overall amount of measured output-noise power will be larger for frequencies in the transition region near the passband, resulting in a displayed NF that is greater than the actual NF.

Figure 2:
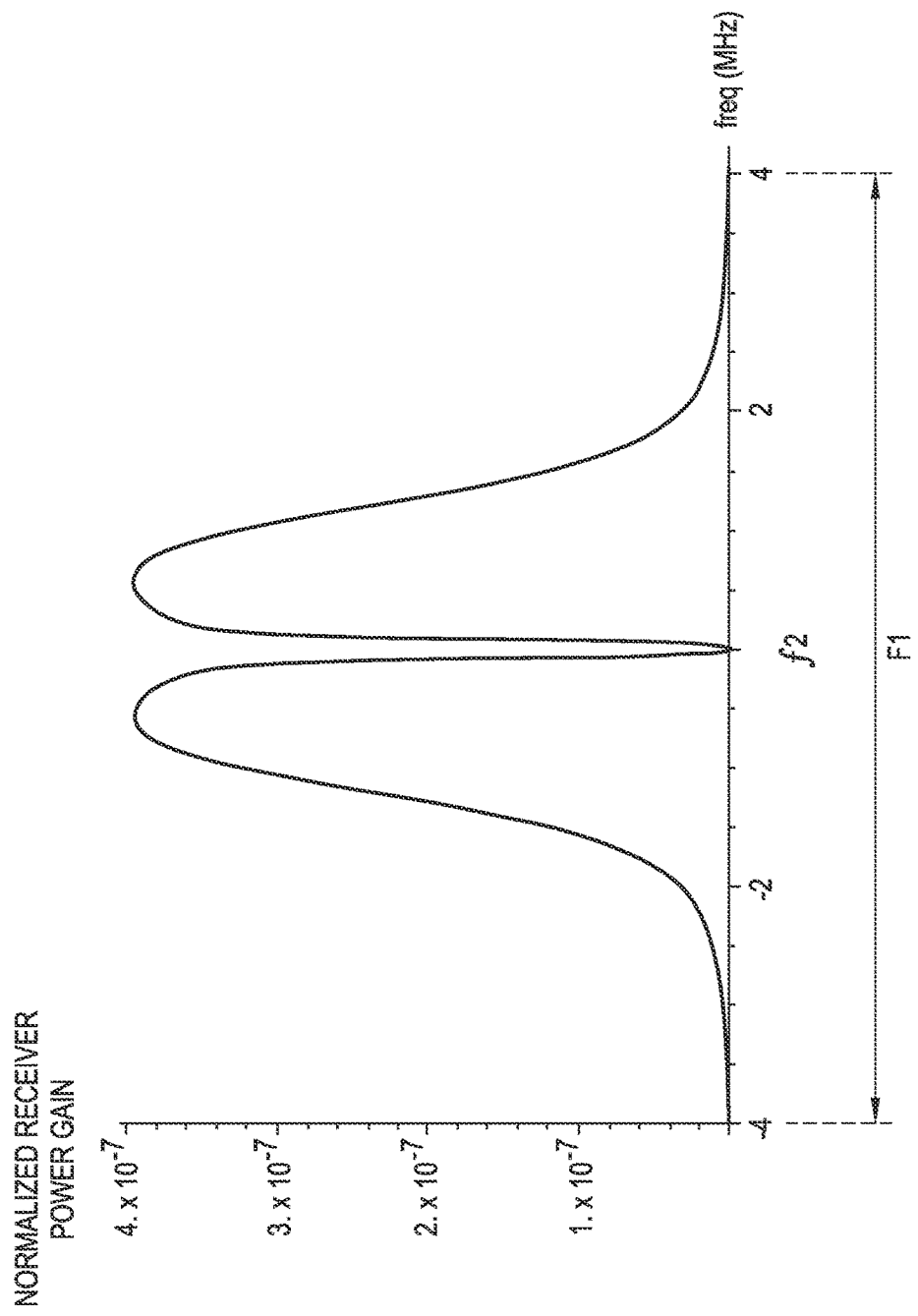
FIG. 2 is a graph illustrating a normalized frequency response of a noise receiver, according to a representative embodiment.
Figure 3:
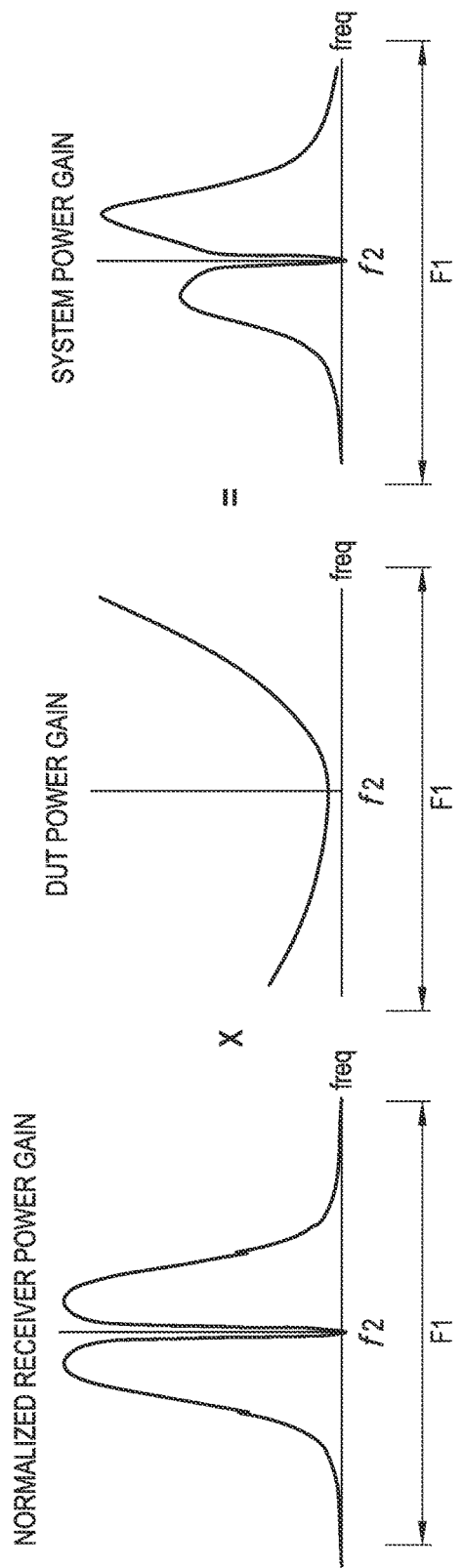
FIG. 3 is a graph illustrating multiplication of the normalized frequency response of the noise receiver and a frequency response of a DUT, according to a representative embodiment.

To avoid distortion produced by the discrepancy between output-noise power measurements and gain measurements, an estimated value of DUT gain at a specified frequency point may be determined in consideration of both (A) a frequency response of the noise receiver across a frequency range encompassing the specified frequency point, and (B) measured values of DUT gain across the same frequency range. FIGS. 2 and 3 show examples of certain steps that can be used to determine the estimated value of DUT gain.

FIG. 2 is a graph illustrating a normalized frequency response of a noise receiver, according to a representative embodiment. Such a frequency response can generally be determined prior to performing NF measurements and then stored in a file. Alternatively, it could be generated as part of an NF measurement procedure.

Referring to FIG. 2, a first frequency range F1 typically corresponds to a noise-bandwidth of a filter within the noise receiver. First frequency range F1 is generally smaller than a second frequency range F2 corresponding to the operating bandwidth of the DUT. A specified frequency point f2 indicates a location at which an estimated gain value is to be determined. The frequency response is normalized by integrating it over first frequency range F1 to determine a normalization factor and then dividing each point in the frequency response by the normalization factor so that the area under the curve is 1.

FIG. 3 is a graph illustrating multiplication of the normalized frequency response of the noise receiver by a frequency response of a DUT, according to a representative embodiment.

Referring to FIG. 3, the normalized frequency response of the noise receiver has the shape illustrated in FIG. 2, which is merely an example, and the frequency response of the DUT has a concave shape, which is also merely an example. The example DUT frequency response may represent, for instance, a frequency response in a transition region. The two frequency responses are multiplied over first frequency range F1 to produce a third frequency response shown on the right side of FIG. 3. The third frequency response can be integrated and then normalized to produce the estimated gain value for the specified frequency point f2. This estimated gain value will vary according to changes in the DUT gain across first frequency range F1, which will tend to reduce over-calculation or under-calculation of NF at the specified frequency point f2.

Figure 4:
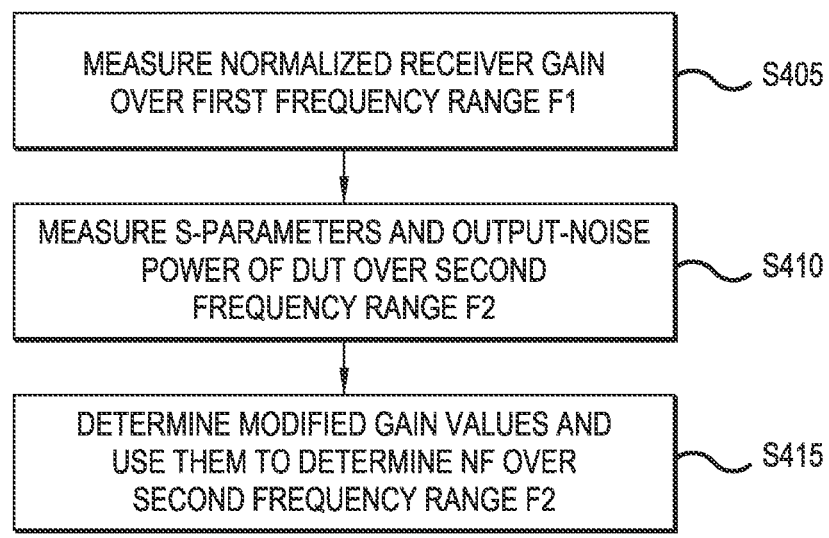
FIG. 4 is a flowchart illustrating a method of determining the NF response of a DUT, according to a representative embodiment.
Figure 5:
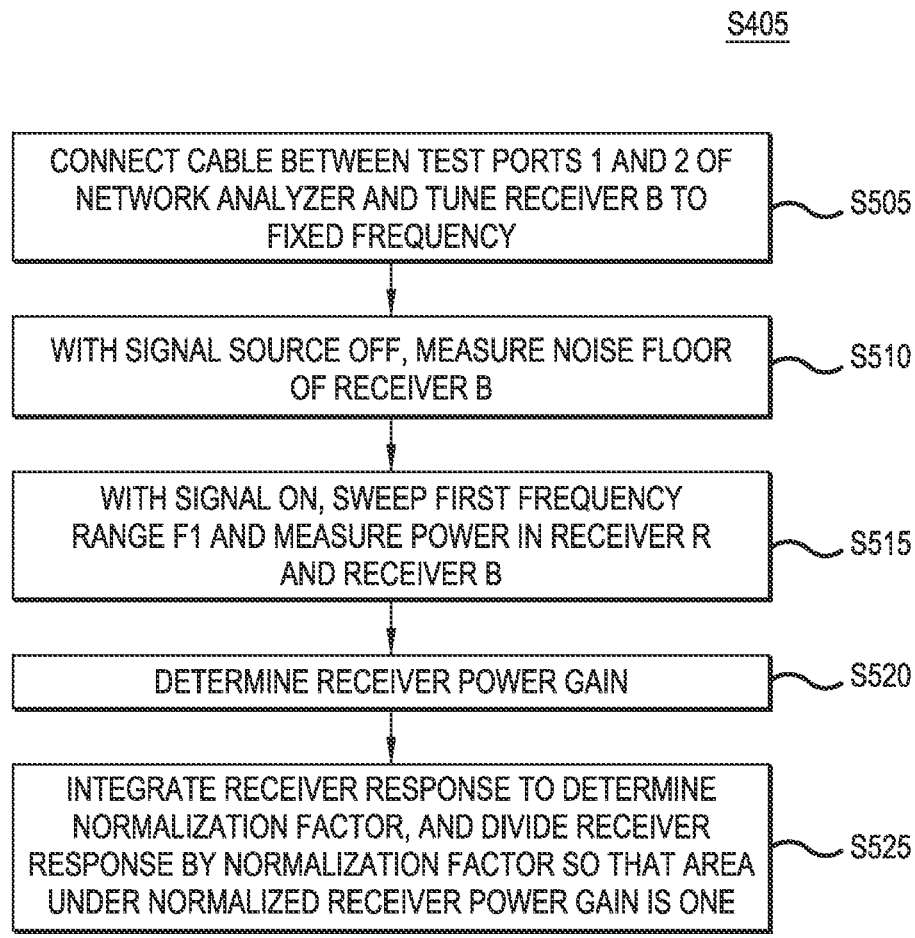
FIG. 5 is a flowchart illustrating an operation in the method of FIG. 4 in further detail, according to a representative embodiment.
Figure 7:
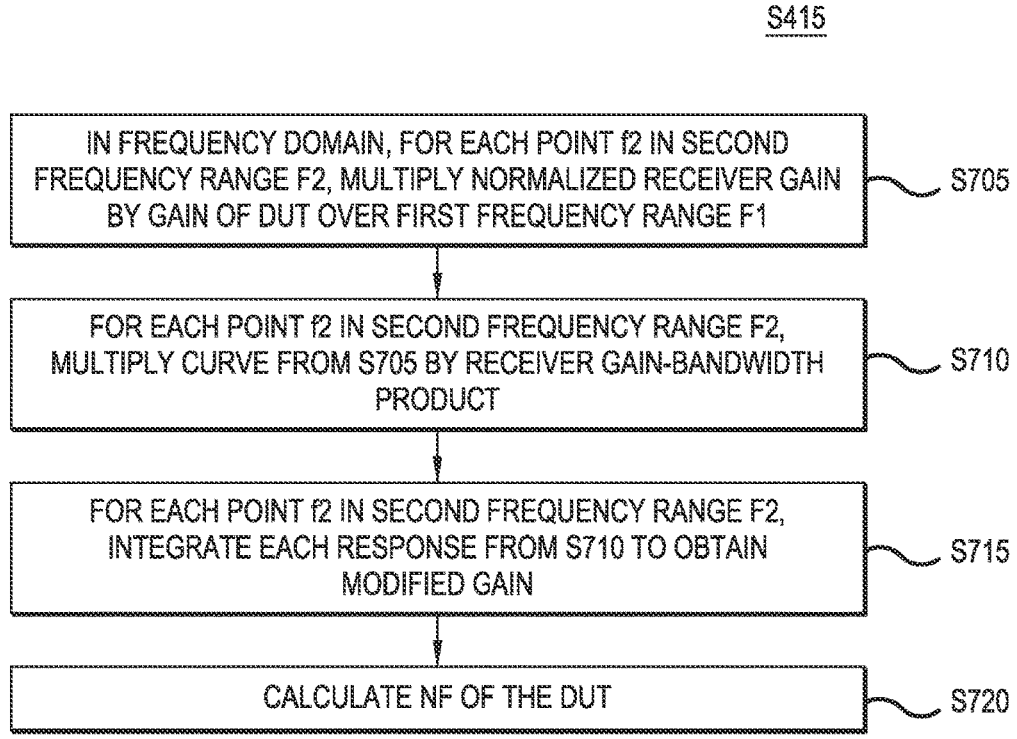
FIG. 7 is a flowchart illustrating yet another operation in the method of FIG. 4 in further detail, according to a representative embodiment.

FIG. 4 is a flowchart illustrating a method 400 of determining the NF response of a DUT, according to a representative embodiment. FIGS. 5 through 7 are flowcharts illustrating more detailed examples of operations performed in the method of FIG. 4. For convenience, certain operations shown in FIGS. 4 through 7 will be described with reference to system 100 of FIG. 1, although the described concepts are not limited to this or any other particular system implementation. In addition, those skilled in the art will recognize that the operations described with reference to FIGS. 4 through 7 are not necessarily limited to the illustrated order. For example, a determination of system gain by operation S710 could be performed in an earlier position among the illustrated operations.

Referring to FIG. 4, method 400 comprises the following. First, normalized receiver gain (i.e., the normalized gain of second test receiver 155) is measured (or alternatively, e.g., read from a file) over first frequency range F1 (S405). Examples of first frequency range F1 and the normalized receiver gain are shown in FIG. 2. Next, S-parameters and output-noise power of DUT 110 are measured over second frequency range F2, which is typically greater than first frequency range F1 (S410). The gain of DUT 110 can be determined from the measured S-parameters. Thereafter, estimated gain values are determined by multiplying the measured gain of DUT 110 by the normalized receiver gain, and multiplying that product by the gain-bandwidth product of the noise receiver at frequency f2. This last quantity is known at the completion of the noise calibration. The estimated gain values are then used in combination with the measured output-noise power to determine NF versus frequency range F2 of DUT 110 (S415).

FIG. 5 is a flowchart illustrating operation S405 of FIG. 4 in further detail, according to a representative embodiment.

Referring to FIG. 5, the measurement of normalized receiver gain over first frequency range F1 can be performed as follows. First, a cable is connected between first and second test ports 1 and 2 of VNA 105, and second test receiver 155 is tuned to a fixed frequency (S505). Next, with signal source 115 turned off, a noise floor of second test receiver 155 is measured (S510). Then, with signal source 115 turned on, first frequency range F1 is swept, and power is measured in first reference receiver 140 and second test receiver 155 across the swept frequency (S515).

Next, the power gain of second test receiver 155 is determined across first frequency range F1 based on the following equation: $(P_B - \text{noise floor})/P_{R1}$, where $P_B$ denotes the measured power at second test receiver 155 (receiver B), "noise floor" denotes the measured power of the noise floor, and $P_{R1}$ denotes the measured power at first reference receiver 140 (S520). Finally, the determined power gain is integrated across first frequency range F1 to determine a normalization factor, and then each of the results of operation S520 is divided by the normalization factor so that the area of under the normalized receiver power gain is one (S525). An example of the resulting normalized receiver gain is shown in FIG. 2, for a noise bandwidth of 4 MHz.

FIG. 6 is a flowchart illustrating operation S410 of FIG. 4 in further detail, according to a representative embodiment.

Referring to FIG. 6, the measurement of S-parameters and output-noise power of DUT 110 over second frequency range F2 can be performed as follows. First, a noise-receiver calibration is performed over second frequency range F2 to determine a gain-bandwidth product of the noise receiver (e.g., second test receiver 155) and to further determine S-parameter vector-error correction terms for each frequency point f2 in second frequency range F2 (S605). The most common way to measure the gain-bandwidth product in this context is to use a noise source with a calibrated amount of excess noise, defined in an ENR file. Next, DUT 100 is connected between first and second test ports 1 and 2 of VNA 105 (S610). With signal source 115 turned on, swept frequency measurements are performed over second frequency range F2 to determine S-parameters of DUT 110 (S615). With signal source 115 turned off, output-noise power measurements of DUT 110 (S615) are performed over second frequency range F2.

FIG. 7 is a flowchart illustrating operation S415 of FIG. 4 in further detail, according to a representative embodiment.

Referring to FIG. 7, in the frequency domain, for each frequency point f2 in second frequency range F2, the normalized receiver gain produced by operation S525 is multiplied by the gain of DUT 110, which was calculated from its S-parameters obtained in operation S615 over first frequency range F1 (S705). An example of this multiplication is illustrated in FIG. 3.

Next, for each frequency point f2 in second frequency range F2, the curve produced by operation S705 is multiplied by the receiver gain-bandwidth product produced by operation S605 (S710). Then, for each frequency point f2 in second frequency range F2, each response produced by operation S710 is integrated to obtain a modified gain term G' for DUT 110+noise receiver (second test receiver 155) (S715). Finally, the NF response of DUT 110 is determined according to the following equation: $NF=10 \log(N_o/(G'k-T_oB))$, where $N_o$ denotes corrected output noise power obtained in operation S615, $T_o$ denotes a reference temperature (e.g., 290 K), "k" denotes Boltzmann's constant, and "B" denotes the noise bandwidth of the receiver used for the noise-power measurements, which is second test receiver 155 in this example.

Figure 8:
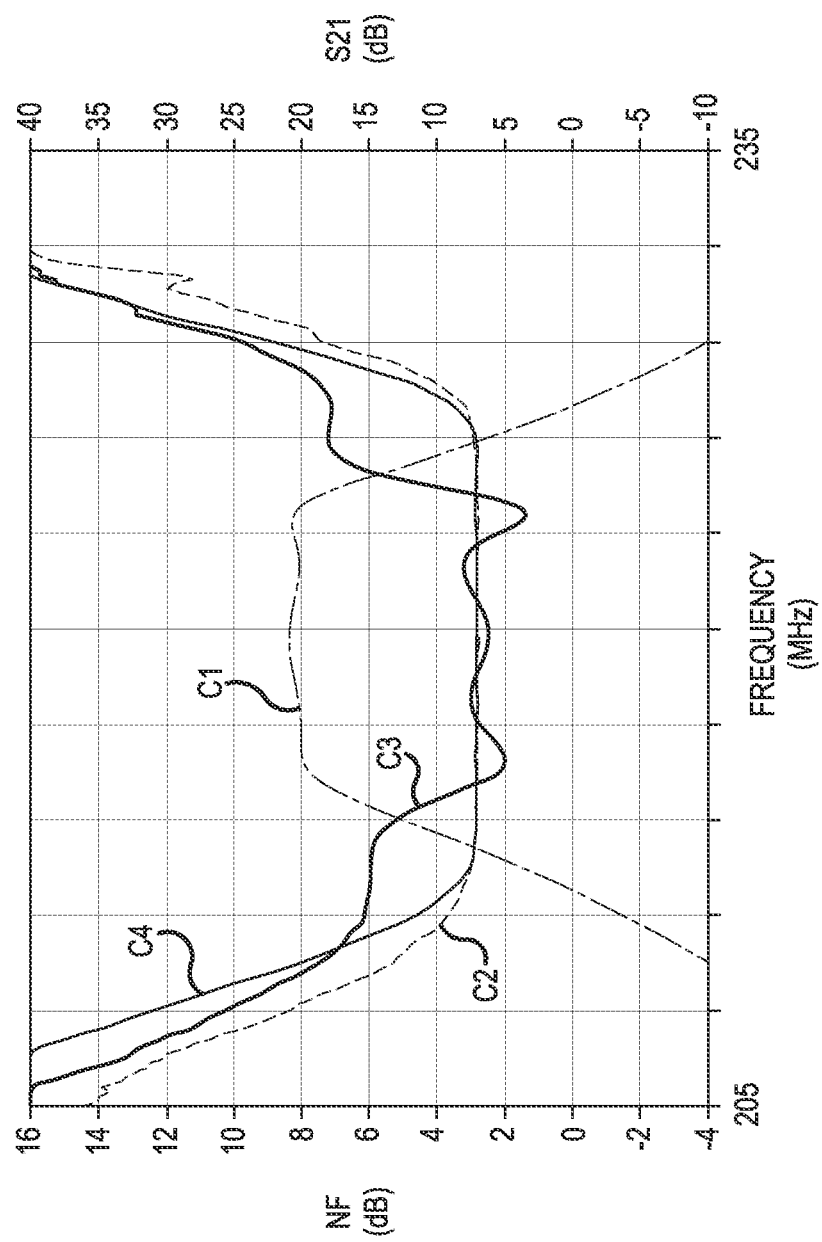
FIG. 8 is a graph illustrating a comparison between an NF response produced by conventional techniques and an NF response produced by the method of FIGS. 4 through 7, according to a representative embodiment.

FIG. 8 is a graph illustrating a comparison between an NF response produced by conventional techniques and an NF response produced by the method of FIGS. 4 through 7, according to a representative embodiment. The NF responses shown in FIG. 8 were generated with respect to a DUT comprising a broadband low-noise amplifier (LNA) followed by a bandpass filter centered at 220 MHz with a bandwidth of 9.3 MHz, and a noise receiver having noise bandwidth of 2 MHz, which constitutes a significant portion of the DUT's bandwidth.

Referring to FIG. 8, a first curve C1 represents the frequency response of the DUT (S21), which comprises a passband region and transition regions on both sides of the passband region. The scale of first curve C1 is shown on the y-axis on the right side of FIG. 8, while the scale of other curves is shown on the y-axis on the left side of FIG. 8.

A second curve C2 represents the noise figure (NF) response of the DUT measured with the Y-factor method. This NF response is substantially flat over the passband region and well into the transition regions on either side of the passband. This can be explained by the fact that the LNA's noise figure dominates the noise figure of the DUT, and the LNA has a flat NF response over this frequency range. The SNR (and therefore the NF) of the DUT should not degrade until the loss of the filter overcomes the excess noise coming from the LNA, which occurs approximately when the gain (S21) of the DUT drops below unity (zero dB), as shown in FIG. 8.

A third curve C3 represents the NF response of the DUT measured with a conventional implementation of the cold-source method. The NF response shows lots of ripple, with large negative-going peaks near the 3 dB frequencies of the DUT. The measured NF response shows significant degradation just outside the 3 dB bandwidth, which is not the DUT's real response.

A fourth curve C4 represents the NF response of the DUT measured with the method of FIGS. 4 through 7, i.e., with narrowband compensation. This NF response overlays nicely with the Y-factor measurement over the passband region, and well into the transition regions on either side of the passband.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method, executed by a network analyzer comprising a noise receiver, of determining a noise figure (NF) response of a device under test (DUT), the method comprising:
   determining a frequency response of the noise receiver over a first frequency range;
   measuring, with the noise receiver, a gain of the DUT over a second frequency range broader than and encompassing the first frequency range;
   measuring, with the noise receiver, output-noise power of the DUT over the second frequency range;
   determining an estimated gain of the DUT based on the frequency response of the noise receiver and the gain of the DUT over the first frequency range; and
   determining the NF response of the DUT over the second frequency range based on the estimated gain and the output-noise power.

2. The method of claim 1, wherein determining the estimated gain of the DUT comprises multiplying the frequency response of the noise receiver by the determined gain of the DUT over the first frequency range and normalizing the product of the multiplication.

3. The method of claim 1, wherein determining the frequency response of the noise receiver over the first frequency range comprises:
   with a cable connected directly between first and second test ports of the network analyzer, measuring a noise floor of the noise receiver and measuring power of the noise receiver and a reference receiver while sweeping a test signal over the first frequency range; and
   determining the frequency response of the noise receiver over the first frequency range based on the measured noise floor, the measured power of the noise receiver, and the measured power of the reference receiver.

4. The method of claim 1, wherein determining the gain of the DUT over the second frequency range comprises, with the DUT connected between first and second test ports of the network analyzer, sweeping a test signal across the second frequency range and measuring S-parameters of the DUT based on the swept test signal.

5. The method of claim 4, further comprising measuring the output-noise power of the DUT over the second frequency range.

6. The method of claim 5, further comprising:
   determining a gain-bandwidth product of the noise receiver over the second frequency range; and
   determining S-parameter vector-error correction terms of the noise receiver over the second frequency range.

7. The method of claim 6, wherein determining the estimated gain of the DUT comprises:
   in the frequency domain, for a specified frequency in the second frequency range, multiplying the frequency response of the noise receiver by the gain of the DUT over the first frequency range to produce a first result, multiplying the first result by the gain-bandwidth product to produce a second result, and integrating the second result to produce the estimated gain for the specified frequency.

8. The method of claim 1, wherein the NF response is determined according to an equation $NF=10\ \log(N_o/(G'k\text{-}T_oB))$, wherein $G'$ denotes the estimated gain of the DUT, $N_o$ denotes the output-noise power of the DUT, $T_o$ denotes a reference temperature, k denotes Boltzmann's constant, and B denotes a noise bandwidth of the noise receiver.

9. The method of claim 1, wherein the DUT comprises at least one bandpass filter.

10. The method of claim 1, wherein the first frequency range corresponds to a noise bandwidth of the DUT.

11. The method of claim 1, wherein determining the frequency response of the noise receiver over the first frequency range comprises accessing a file including a stored representation of the frequency response.

12. A method, executed by a network analyzer comprising a noise receiver, of determining a noise figure (NF) response of a device under test (DUT), the method comprising:
   determining a frequency response of the noise receiver over a first frequency range;
   measuring, with the noise receiver, a gain of the DUT over a second frequency range broader than and encompassing the first frequency range;
   for a specified frequency point, multiplying the gain of the DUT over the first frequency range with the frequency response of the noise receiver over the first frequency range to produce a first result, integrating the first result to produce a normalization factor, and dividing the first result by the normalization factor to produce an effective gain value of the DUT at the specified frequency point; and
   determining an NF value for the specified frequency point based on the effective gain value of the DUT and an output-noise power of the DUT.

13. The method of claim 12, further comprising:
   with a cable connected directly between first and second test ports of the network analyzer, measuring a noise floor of the noise receiver and measuring power of the noise receiver and a reference receiver while sweeping a test signal over the first frequency range; and
   determining the frequency response of the noise receiver over the first frequency range based on the measured noise floor, the measured power of the noise receiver, and the measured power of the reference receiver.

14. The method of claim 12, wherein the network analyzer determines the frequency response of the noise receiver across the first frequency range by reading it from a file and determines the gain of the DUT by performing S-parameter measurements with the DUT connected between first and second test ports.

15. The method of claim 12, wherein the NF value is determined according to an equation $NF=10\ \log(N_o/(G'k\text{-}T_oB))$, wherein $G'$ denotes the effective gain value, $N_o$ denotes the output-noise power of the DUT, $T_o$ denotes a reference temperature, k denotes Boltzmann's constant, and B denotes a noise bandwidth of the noise receiver.

16. The method of claim 12, wherein the first frequency range corresponds to a noise bandwidth of the DUT.

17. The method of claim 12, wherein the DUT comprises at least one bandpass filter.

18. A system configured to determine a noise figure (NF) response of a device under test (DUT), the system comprising:
- a network analyzer comprising a noise receiver;
- a first module configured to determine a frequency response of the noise receiver over a first frequency range;
- a second module configured to measure a gain of the DUT over a second frequency range broader than and encompassing the first frequency range;
- a third module configured to measure output-noise power of the DUT over the second frequency range;
- a fourth module configured to determine an estimated gain of the DUT based on the frequency response of the noise receiver and the gain of the DUT over the first frequency range; and
- a fifth module configured to determine the NF response of the DUT over the second frequency range based on the estimated gain and the output-noise power.

19. The system of claim 18, wherein the first through fifth modules are disposed in the network analyzer.

20. The system of claim 18, wherein the fourth module determines the estimated gain of the DUT by multiplying the frequency response of the noise receiver by the determined gain of the DUT over the first frequency range and normalizing a product of the multiplication.

* * * * *